(12) United States Patent
Nakamura et al.

(10) Patent No.: US 7,790,612 B2
(45) Date of Patent: Sep. 7, 2010

(54) INCREASED GRAIN SIZE IN METAL WIRING STRUCTURES THROUGH FLASH TUBE IRRADIATION

(75) Inventors: Hiroki Nakamura, Ageo (JP); Masaki Kado, Saitama (JP); Shigeru Aomori, Kashiwa (JP)

(73) Assignees: Toshiba Mobile Display Co., Ltd., Fukaya-shi (JP); Sharp Kabushiki Kaisha, Osaka-shi (JP)

( * ) Notice: Subject to any disclaimer, the term of this patent is extended or adjusted under 35 U.S.C. 154(b) by 124 days.

(21) Appl. No.: 11/531,873

(22) Filed: Sep. 14, 2006

(65) Prior Publication Data

US 2007/0072417 A1 Mar. 29, 2007

(30) Foreign Application Priority Data

Sep. 28, 2005 (JP) .............................. 2005-281894

(51) Int. Cl.
*H01L 21/4763* (2006.01)
*H01L 21/00* (2006.01)
(52) U.S. Cl. ................ 438/660; 438/795; 257/E21.575
(58) Field of Classification Search ................ 438/660, 438/663, 795–797; 257/E21.575
See application file for complete search history.

(56) References Cited

U.S. PATENT DOCUMENTS

| 2004/0171264 | A1* | 9/2004 | Kondo et al. | 438/691 |
|---|---|---|---|---|
| 2004/0180532 | A1* | 9/2004 | Shue et al. | 438/626 |
| 2005/0048768 | A1* | 3/2005 | Inoue et al. | 438/629 |
| 2005/0084609 | A1* | 4/2005 | Kocha et al. | 427/239 |
| 2005/0142875 | A1* | 6/2005 | Yoo | 438/687 |
| 2005/0173799 | A1* | 8/2005 | Jou et al. | 257/751 |
| 2006/0019480 | A1* | 1/2006 | Cheng et al. | 438/612 |
| 2006/0024952 | A1* | 2/2006 | Ikenoue et al. | 438/628 |
| 2006/0051948 | A1* | 3/2006 | Kim et al. | 438/597 |
| 2006/0079025 | A1* | 4/2006 | Kripesh et al. | 438/113 |
| 2007/0032054 | A1* | 2/2007 | Ramaswamy et al. | 438/513 |

FOREIGN PATENT DOCUMENTS

| JP | 1-225136 | 9/1989 |
|---|---|---|
| JP | 4-326521 | 11/1992 |
| JP | 10-32203 | 2/1998 |
| JP | 2001-68679 | 3/2001 |
| JP | 2002-118078 | 4/2002 |

OTHER PUBLICATIONS

CRC Handbook of Chemistry and Physics, 89th Edition, 2008-2009.*
T.S. Kuan, et al., "Fabrication and Performance Limits of Sub-0.1 μm Cu Interconnects", Material Research Society Symposium Proceeding, vol. 612, 2000, 8 Pages.
Hong-Hui Hsu, et al., "Electroless Copper Deposition for Ultralarge-Scale Integration", Journal of The Electrochemical Society, vol. 148 (1), 2001, 7 Pages.

* cited by examiner

*Primary Examiner*—Hsien-ming Lee
*Assistant Examiner*—Kevin Parendo
(74) *Attorney, Agent, or Firm*—Oblon, Spivak, McClelland, Maier & Neustadt, L.L.P.

(57) ABSTRACT

A method for forming a wiring structure includes forming a metal layer on a substrate, and annealing the metal layer by irradiating the metal layer with light emitted from at least one flash tube, thereby growing crystalline grains of the metal layer.

8 Claims, 12 Drawing Sheets

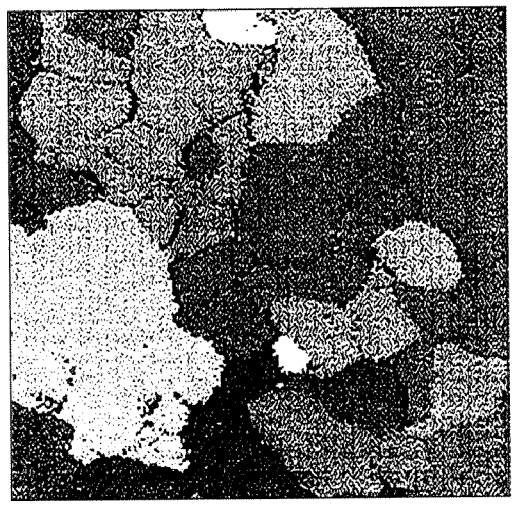
F I G. 6C
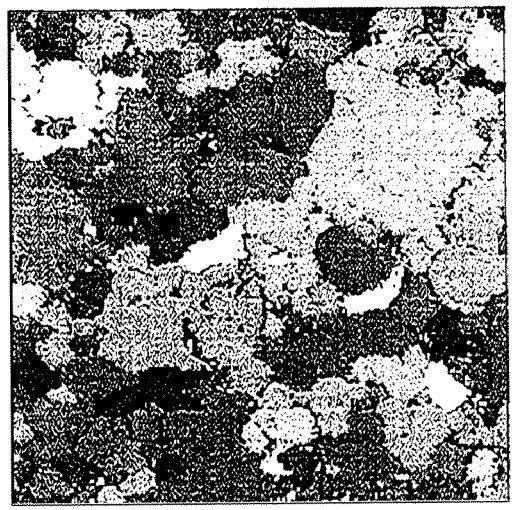
F I G. 6B
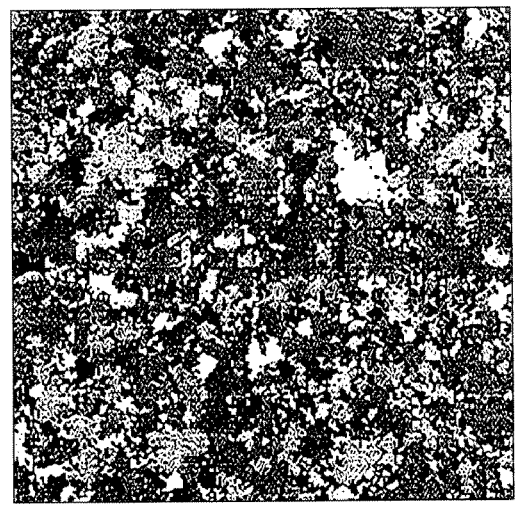
F I G. 6A

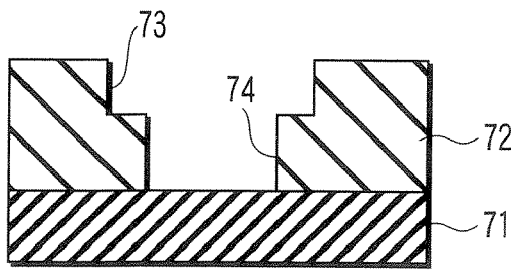
FIG. 10A
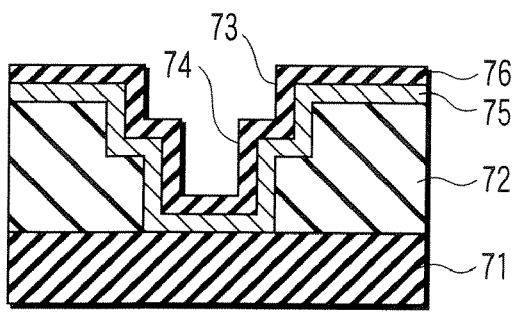
FIG. 10B
FIG. 10D
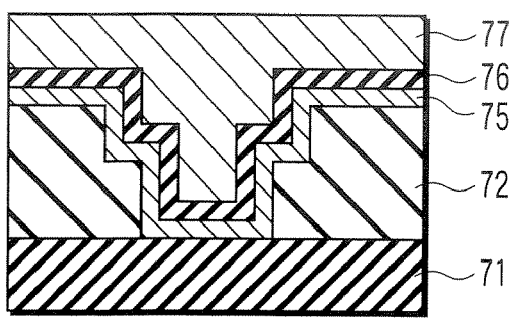
FIG. 10C
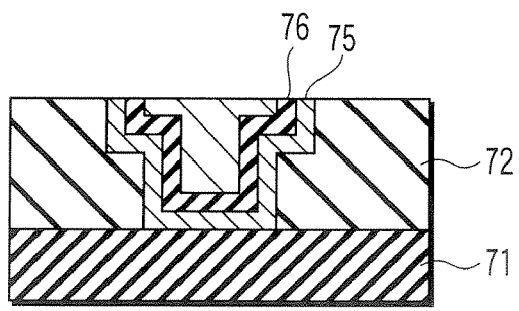
FIG. 10E

INCREASED GRAIN SIZE IN METAL WIRING STRUCTURES THROUGH FLASH TUBE IRRADIATION

CROSS-REFERENCE TO RELATED APPLICATIONS

This application is based upon and claims the benefit of priority from prior Japanese Patent Application No. 2005-281894, filed Sep. 28, 2005, the entire contents of which are incorporated herein by reference.

BACKGROUND OF THE INVENTION

1. Field of the Invention

The present invention relates to: a wiring structure forming method suitable for use in a display device represented by a liquid crystal display device and a semiconductor device represented by large-scale integrated circuit; a wiring structure; a semiconductor device forming method suitable for manufacture of a thin-film transistor or the like; and a display device.

2. Description of the Related Art

In general, an aluminum (Al) layer and/or an aluminum alloy layer is mainly used as a metal layer which is applied to wires or electrodes of a semiconductor device represented by a large-scale integrated circuit (LSI) or an ultra large-scale integrated circuit (ULSI). In recent years, there has been a growing demand for further downsizing, thinner wiring, higher operating speed and the like in order to improve integrity in the field of semiconductor devices represented by such LSIs and ULSIs. For this reason, copper (Cu) or its alloy having lower specific resistance than aluminum and having high tolerance to, for instance, electro-migration or storage migration has been discussed as a material for a next generation wiring structure (such as wires or electrodes).

Also in the field of display devices represented by a liquid crystal display device, in recent years, there has been a tendency for wiring length to increase because of expansion of a display area. In addition, monolithic production of peripheral circuit portions including a driver circuit and development of acquiring added functions such as a pixel internal memory or an optical sensor have been underway. Therefore, in the field as well, there has been a growing demand for low-resistance wiring structure, as in the semiconductor field.

A wiring structure consisting essentially of copper has been conventionally formed in accordance with a sputtering method, a CVD method, a plating method or the like. The above-described technique or techniques are disclosed in, for example, Jpn. Pat. Appln. KOKAI Publication No. 2001-68679, Material Research Society Symposium Proceeding Vol. 612 D. 7.1.1 (2000) and Journal of Electrochemical Society Vol. 148, C47-C53 (2001).

It is known that a wiring layer (wiring structure) formed by the sputtering method, CVD method, plating method or the like, and consisting essentially of copper, is small in crystalline grain size and comparatively large in specific resistance. Conventionally, in the case where a metal layer consisting essentially of copper is used as a wiring structure, this metal layer is subjected to annealing (furnace annealing) by a heat source such as a heater in a heating furnace, thereby increasing the size of crystalline grains and lowering a specific resistance value.

However, if the metal layer consisting essentially of copper is annealed by furnace annealing, there newly occurs a problem that surface irregularities increase due to crystalline grain growth although crystalline grains increase in size and specific resistance is lowered. For this reason, there is a problem that a metal layer made of crystalline grains grown by annealing is hardly applied to a semiconductor device or a display device.

BRIEF SUMMARY OF THE INVENTION

It is an object of the present invention to provide: a method for forming a wiring structure having small surface irregularities and low specific resistance; a wiring structure: a method for a forming semiconductor device; and a display device.

A wiring structure forming method according to a first aspect of the present invention comprises: a step of forming a metal layer on a substrate; an annealing process of annealing the metal layer by irradiating the metal layer with light emitted from a flash tube or tubes, thereby growing crystalline grains of the metal layer.

A wiring structure forming method according to a second aspect of the present invention comprises: forming a metal layer on a substrate; and annealing the metal layer by irradiating the metal layer with light emitted from a flash tube or tubes having maximum intensity in a wavelength range of 300 to 600 nm, thereby growing crystalline grains of the metal layer.

A wiring structure forming method according to a third aspect of the present invention comprises: forming a metal layer on a substrate; etching the metal layer in a wiring pattern shape to form a wiring structure pattern; and annealing the metal layer by irradiating the wiring structure pattern with light emitted from a flash tube or tubes, thereby growing crystalline grains of the metal layer.

A wiring structure according to a fourth aspect of the present invention comprises: a substrate composed of an insulator; a wiring pattern provided on the substrate and irradiated with flash tube light, crystalline grains of which are grown.

A semiconductor device forming method according to a fifth aspect of the present invention comprises: forming a semiconductor layer on a substrate; forming an insulating film on the semiconductor layer; forming a metal layer on the insulating film; processing the metal layer to form a wiring structure; and irradiating at least one of the metal layer and the wiring structure with light emitted from a flash tube to apply annealing which grows crystalline grains of the metal layer.

The term "wiring structure" used in the present invention includes a wire, a terminal, an electrode and the like. As a substrate, there can be used a general glass, a quartz glass, a ceramics, a silicon wafer, or the like solely or in combination. In addition, as a substrate, there may be used, for example, an insulating film and a semiconductor layer formed in single or plural layers on an insulator, semiconductor, or conductor substrate made of general glass, quartz glass, a silicon wafer, resin or the like. In the case of forming the plurality of layers, a plurality of layers may be vertically laminated, horizontally arranged, or combined thereof. The above-described insulating layer and semiconductor layer may form circuit elements or part of the circuit elements. A circuit element may include a semiconductor device or devices such as a thin-film transistor.

It is preferable to use a material consisting essentially of copper as the above-described metal layer.

A semiconductor device forming method according to the sixth aspect of the present invention includes forming a semiconductor layer on a substrate; forming an insulating film on the semiconductor layer; forming a metal layer on the insulating film; and applying flash tube annealing to the metal layer.

A semiconductor device forming method according to the seventh aspect of the present invention includes forming a metal layer on a substrate; applying flash tube annealing to the metal layer; forming an insulating film on the metal layer; and forming a semiconductor layer on the insulating film.

In the present invention, it is preferable to use a material consisting essentially of copper as the metal layer. It is preferable that the metal layer consisting essentially of copper is made of approximately 90% or more of copper. More preferably, the metal layer is made of 98% or more of copper. In the present invention, the metal layer consisting essentially of copper includes a pure copper. Elements other than copper included in the metal layer include magnesium (Mg), titanium, (Ti), molybdenum (Mo), tantalum (Ta) or chromium (Cr).

According to the wiring structure forming method or semiconductor device forming method as described above, annealing for a short time is carried out, so that crystalline grain size can be increased while increase of surface irregularities is suppressed.

According to the wiring structure forming method, wiring structure, semiconductor device forming method, and display device as described above, there can be obtained a wiring structure, a semiconductor device and a display device each having surface irregularities and low specific resistance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A to 6C are crystalline orientation maps respectively including twin crystals of FIGS. 5A to 5C;

FIGS. 10A to 10E are process charts for explaining a Damascene process and an electrolytic plating process according to a modified example of the present invention;

DETAILED DESCRIPTION OF THE INVENTION

Figure 1A:
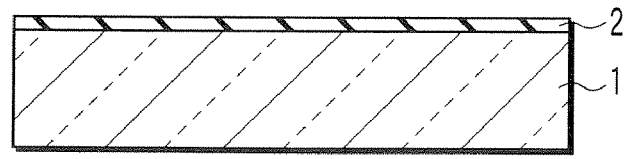
FIGS. 1A to 1H are process charts for explaining a first half portion of a wiring structure forming method according to a first embodiment of the present invention.

Hereinafter, a first embodiment of the present invention will be described with reference to FIGS. 1A to 2. In the present embodiment, one aspect of a wiring structure according to the invention will be described here. FIGS. 1A to 1H show a process for manufacturing a wiring structure according to the present embodiment.

First, as shown in FIG. 1A, a metal or insulator substrate, for example, a rectangular substrate 1 made of a glass is prepared. An undercoat insulating layer 2 made of silicon nitride (SiNx), silicon oxide ($SiO_2$) or the like, having a predetermined thickness, for example, a film thickness of 300 nm, is formed at a whole portion or a selected portion on the surface or the top face of the substrate 1.

Figure 1B:
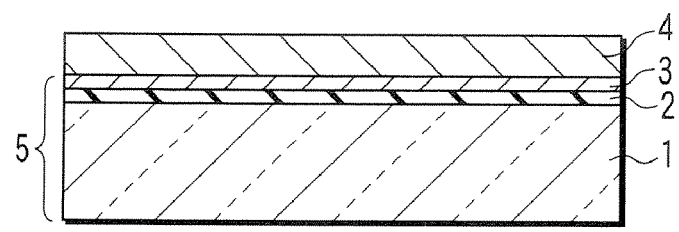

Next, as shown in FIG. 1B, a barrier metal layer 3 having a predetermined thickness, for example, a film thickness of 30 nm is formed on the undercoat insulating layer 2. The barrier metal layer 3 is intended to restrict substances contained in a metal layer 4 described later from diffusing into the undercoat insulating layer 2 and to improve inter-layered coherency. In the wiring structure forming method according to the present embodiment, the substrate 1, the undercoat insulating layer 2, and the barrier metal layer 3 configure a base substance 5. The metal layer 4 for use as a wiring layer is formed on the top face of the base substance 5, i.e., on the barrier metal layer 3. A layer formed of a metal consisting essentially of copper (including pure copper) can be used as the metal layer 4. Hereinafter, the metal layer 4 is referred to as a copper wiring layer. Although the film thickness of the copper wiring layer 4 is arbitrary, the film thickness is 500 nm in this embodiment. The barrier metal layer 3 and the copper wiring layer 4 can be continuously formed in accordance with, for example, a sputtering method.

Figure 1C:
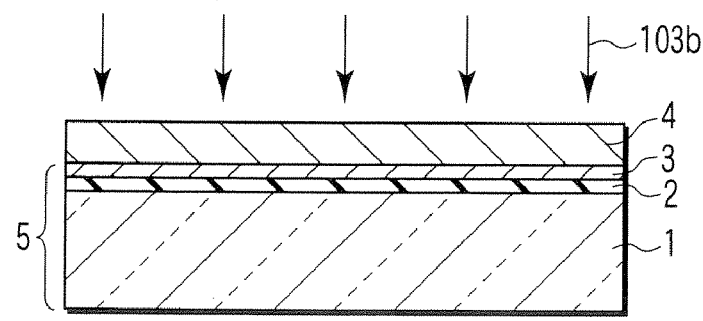

Next, as indicated by arrows shown in FIG. 1C, the copper wiring layer 4 is irradiated with a flash tube light beam 103b emitted from a flash tube to anneal the copper wiring layer or metal layer 4, and thereby the crystalline grain size of this layer are grown. Although a variety of the flash tubes can be used, a xenon (Xe) flash tube or a krypton (Kr) flash tube is preferred. By this irradiation, the copper wiring layer 4 made of a pure copper or consisting essentially of copper is heated, and enters a melted, semi-melted, or almost non-melted state. Hereinafter, this process is referred to as a flash tube heating process (annealing process).

Figure 2:
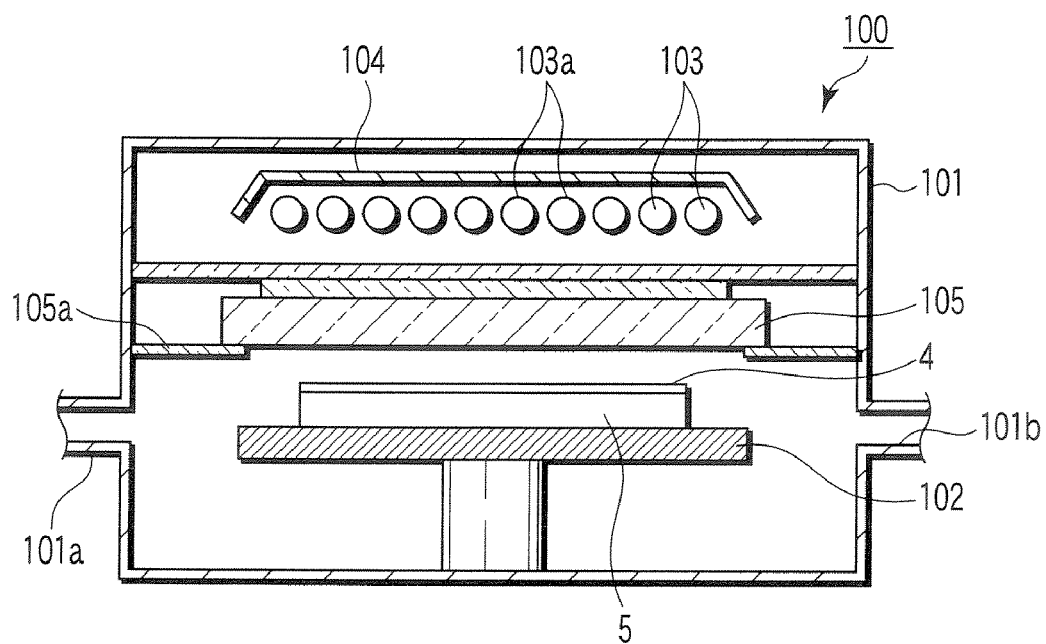
FIG. 2 is a sectional view showing an example of a flash tube heating device for use in the wiring structure forming method according to the first embodiment of the invention.

The flash tube heating process can be carried out by using a flash tube heating device 100 as shown in FIG. 2. The flash tube heating device 100 comprises an air tightness container 101, a support base 102, a plurality of straight flash tubes 103, a reflector 104, and a light transmission plate 105. The air tightness container 101 serves as a processing container. The support base 102 is provided in the air tightness container 101, and supports a base substance 5 having a metal layer or a wiring structure layer 4 formed thereon. The plurality of straight flash tubes 103 are provided so as to be opposed to the base substance 5 above the support base 103, and are arranged parallel to each other. The reflector 104 covers these flash tubes 103 from the opposite side of the base substance 5, i.e., from above. The light transmission plate 105 is formed of quartz or the like having permeability relevant to light of a wavelength from ultraviolet rays to a visible region. The light transmission plate 105 is supported by a support frame 105a fixed to the container 101. The light transmission plate 105 substantially reduces capacity in a processing space by separating in air tightness the inside of the air tightness container 101 into a upper portion in which the flash tubes 103 are housed and an lower portion (processing space) at which the base substance 5 is arranged. The air tightness container 101 has a gas introducing port 101a for introducing a gas such as an inert gas into the container 101, and a gas exhaust port 101b for exhausting the gas contained in the container.

The flash tubes 103 are arranged in plurality (10 lamps in this embodiment) so as to be parallel to each other in a direction orthogonal to the illustrated plane, and are configured as a flash tube unit. However, the number of flash tubes is arbitrary, and may be single, for example. Each flash tube 103 has a straight glass tube 103a having an anode and a cathode (not shown) provided at both ends thereof, and a xenon gas, a krypton gas or the like is sealed in the glass tube 103a. The anode and cathode each are electrically connected to a capacitor (not shown) serving as a driving power circuit. In thus manner, a current flows in the glass tube 103a due to a voltage momentarily applied between the anode and the cathode via the capacitor, and the xenon gas, krypton gas or the like emitted at that time is heated, so that light is emitted. It is preferable that such a flash tube 103 emits flash tube light having a pulse width of 0.1 to 10 ms (more preferably, 0.5 to 5 ms). In this case, electrostatic energy accumulated in advance in the capacitor is converted into a short light pulse of 0.1 to 10 ms (0.5 to 5 ms). For this reason, it is possible to emit extremely strong light as compared with that of a continuously illuminating light source and irradiate and anneal a substrate to be processed.

With the reflector 104, all the flash tubes 103 are covered from the opposite side of the base substance 5. Consequently, from among the flash tube light beams 103b, the flash tube light beams 103b emitted to the opposite side (upwardly) of the base substance 5 are reflected in the direction of the base substance 5. In this manner, all the flash tube light beams 103b are directly emitted from the flash tube 103 or indirectly radiated to the side of the base substance 5 by reflection using the reflector 104. Then, the flash tube light beams 103b pass through the light transmission plate (transmission window) 105, irradiate the copper wiring layer 4 of the base substance 5 to be processed, and anneal the copper wiring layer 4. In this manner, as described above, a wiring structure 6 consisting essentially of copper is formed on the base substance 5.

It is desirable that a heating process (annealing process) using the flash tube should be carried out in an atmosphere made of an annealing inert gas or a vacuum in order to prevent surface oxidization of the copper wiring layer 4.

Conventional furnace annealing or infrared-rays lamp annealing cannot sufficiently grow crystalline grains as long as a heating time is extended. In addition, if furnace annealing or infrared-ray lamp annealing is carried out in order to form a wiring structure on a glass substrate, the glass substrate itself is also heated. In addition, an increase in surface irregularities of the wiring structure occurs due to growth of crystalline grains.

Figure 3:
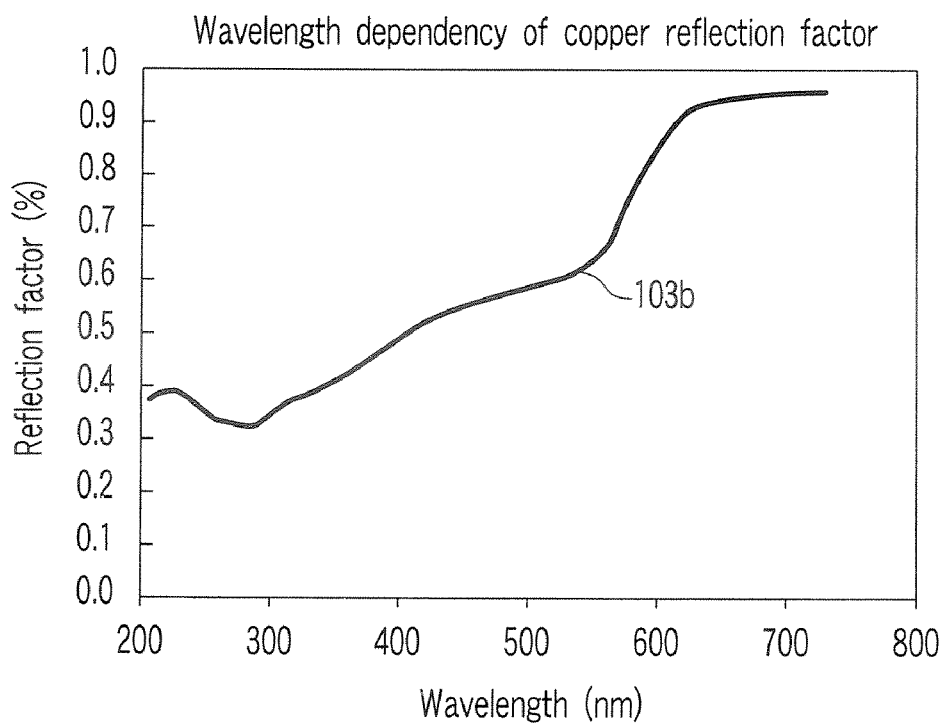
FIG. 3 is a graph showing a waveform dependency of a copper reflection spectrum.
Figure 4:
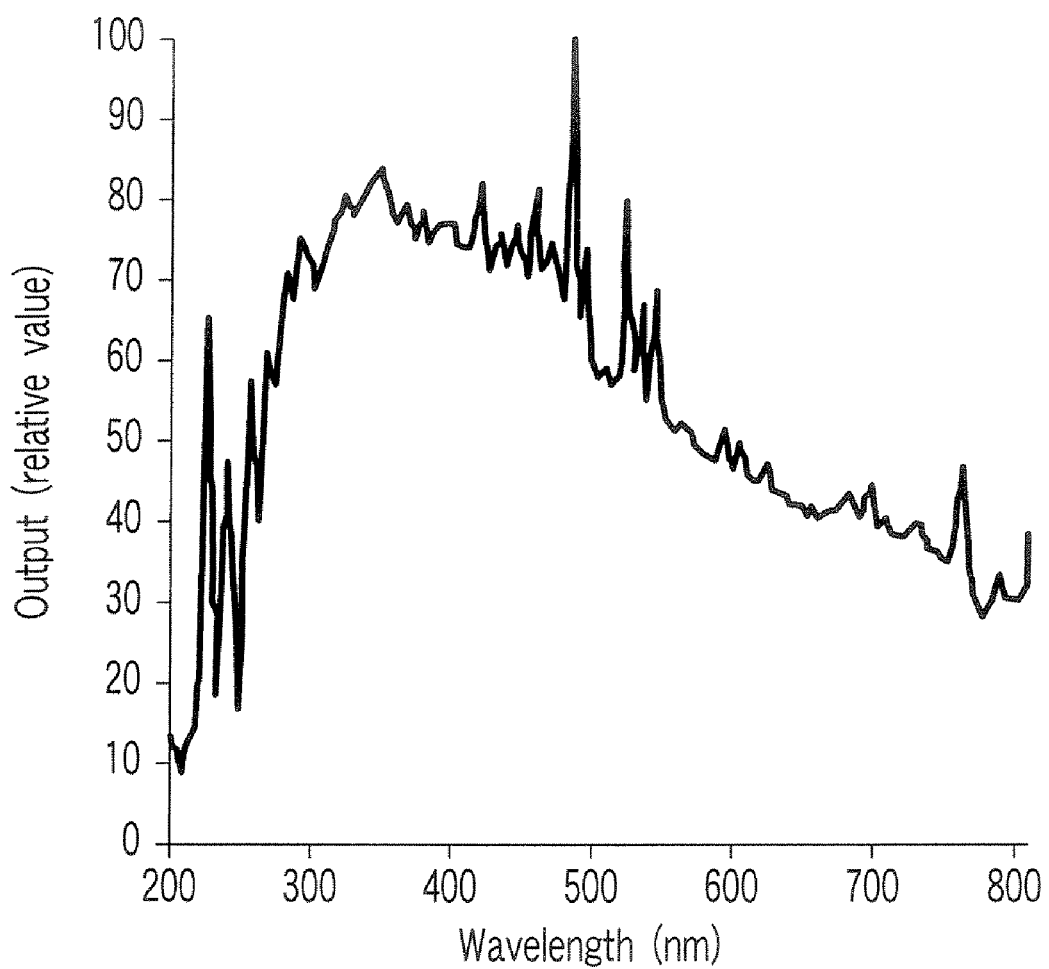
FIG. 4 is a graph showing light emission spectrum of a xenon flash tube.

On the other hand, in the wiring structure forming method according to the present embodiment, a period in which the copper wiring layer 4 is heated may be reduced because the flash tube light 103b is short in pulse width or can be set to be short therein. The copper wiring layer 4 can be directly heated without a need for light deflecting means such as a reflection plate, thus making it possible to produce an increase of crystalline grains, and moreover, making it possible to increase surface irregularities. That is, as shown in FIG. 3, a reflection factor relevant to copper is lowered at a short waveform side equal to or smaller than 600 nm. For this reason, as in an example of light emission spectra shown in FIG. 4, the copper wiring layer 4 efficiently absorbs the flash tube light 103b having a maximum wavelength in the range (region) of 300 to 600 nm to be annealed. FIG. 3 shows a reflectance ratio on a vertical axis and shows a wavelength on a horizontal axis. FIG. 4 shows light emission intensity on a vertical axis and shows a wavelength on a horizontal axis.

When a pulse width of the flash tube light 103b is set in the range of 0.1 to 10 ms, copper diffusion can be restricted even in high temperature annealing, and throughput can be increased.

In a flash tube heating process according to the present invention, the flash tube light emitted from the flash tube 103 has good controllability. Thus, although one flash irradiation relevant to a predetermined region will suffice, a plurality of flash irradiations onto the same part may be available.

That is, in the flash tube heating process, at least one flash irradiation is carried out in batch with respect to a predetermined region of the metal layer 4 of the base substance 5 (the full region of the metal layer 4 in the wiring structure forming method according to the present embodiment).

Further, in the case where an area of one irradiation of flash tube light is smaller than a predetermined region of the metal layer 4, the flash tube heating process may include a process of sequentially changing predetermined small regions of the metal layer 4 and carrying out a plurality of flash irradiations while carrying out stepwise feeding and/or repetition feeding for changing a relative position relationship of the base substance 5 and flash tube 103 in a planar direction of the substrate. It is desirable that, during the above stepwise feeding, the irradiation small regions (in a predetermined region) should overlap at their ends. By doing this, a wide or a predetermined region of the metal layer 4 (including all regions) can be fully annealed uniformly.

In the figure, a mechanism for stepwise feeding and/or repetition feeding is eliminated because a publicly known mechanism can be used. In the feeding, it is easier to move the base substance 5 with respect to the flash tube 103 than to move the flash tube 103 with respect to the base substance 5. Therefore, it is preferable to move the base substance 5 parallel to an irradiation face of the metal layer 4 (horizontally in the embodiment) with respect to a flash tube unit. This is because a portion of the support base 102 of the flash tube heating device 100, on which the base substance 5 is mounted, is positioned on may be movably formed. However, the flash tube unit may be moved or only one or plural flash tubes of the unit may be moved.

Instead, as shown in FIG. 2, in the case where an area of one irradiation of flash tube light is substantially equal to or greater than that of a predetermined region of the metal layer 4, one or plural irradiations may be carried out while both of these areas are fixed.

As the flash tube 103, it is desirable to use a lamp having strong light emission spectra characteristics in intensity in a visible region from ultraviolet rays while controlling a voltage, a current density, a gas pressure, a tube internal diameter and the like. Specifically, a condition range for obtaining light emission intensity of a visible region from ultraviolet rays effective for use in the following testing (refer to FIGS. 5A to 8) was 3,000 to 10,000 A/cm$^2$ in current density. In the flash tube heating process, it is desirable to increase the current density of the flash tube 103 in order of 3,000 to 10,000 A/cm$^2$ in current density in order to increase a plasma temperature and to increase a ratio of energy density for a short wavelength component.

The wiring structure forming method according to the present embodiment, for example, may include a method for processing in a desired pattern, for example, in a wiring pattern, a copper wiring layer 4 (wiring structure 6) subjected to the flash tube annealing process described with reference to FIGS. 1A to 1C. In this method, the copper wiring layer 4 is patterned in accordance with the process as described below, for example.

Figure 1D:
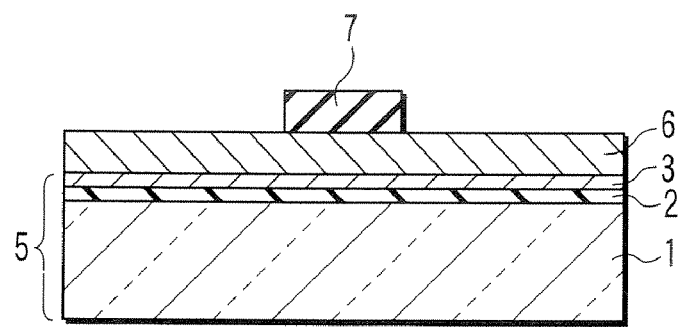

First, as shown in FIG. 1C, on the above-described wiring structure 6 subjected to flash tube annealing process, a photoresist film 7 is formed in accordance with PEP, for example. Then, as shown in FIG. 1D, the photoresist film 7 is processed to be exposed/developed in a desired pattern.

Figure 1E:
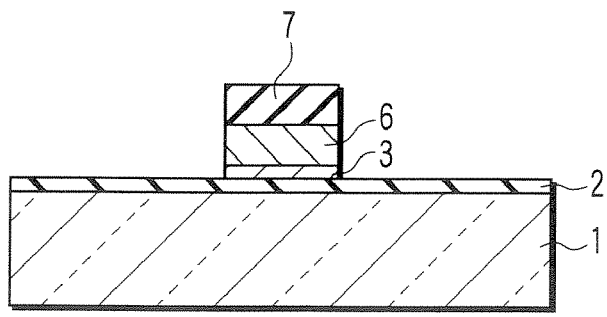
Figure 1F:
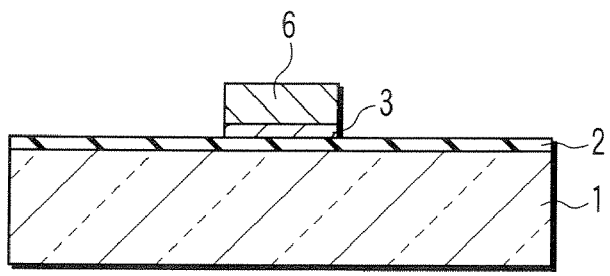

Next, as shown in FIG. 1E, the above-described wiring structure 6 and barrier metal layer 3 are selectively etched with the photoresist film 7 being a mask. Thereafter, as shown in FIG. 1F, the photoresist film 7 is removed from the wiring structure 6 by using a releasing solution or the like. This makes it possible to form the wiring structure 6 of a desired pattern (for example, in an island shape).

Figure 1G:
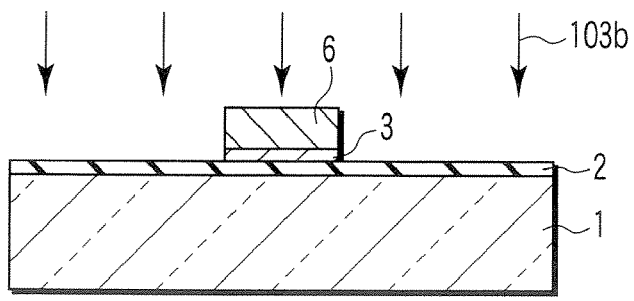

In the wiring structure forming method according to the present embodiment, the flash tube heating process is applied to the copper wiring layer 4 made of copper or consisting essentially of copper, and then, the island shaped wiring structure 6 is formed by applying etching. However, the copper wiring layer 4 is formed in a desired pattern as shown in FIG. 1G, and then, the flash tube heating process may be carried out. As shown in FIGS. 1C and 1G, the flash tube heating process may be carried out both before and after etching. In addition, the flash tube heating process may be carried out only after etching and forming the wiring structure.

Figure 1H:
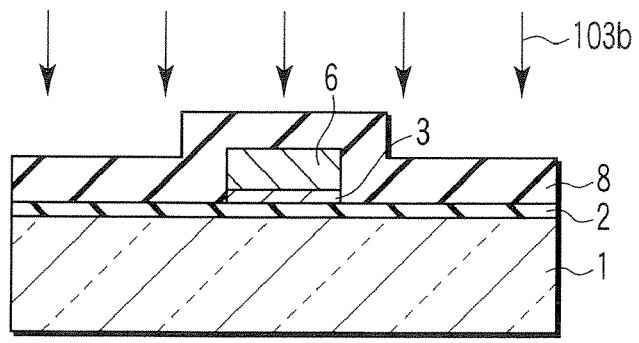

Next, an additional layer 8 such as a protective layer or an insulating film formed of silicon nitride or silicon oxide, including is formed on the wiring structure 6 formed in a desired pattern, and the top of the undercoat insulating layer 2. After forming the additional layer 8, the flash tube heating process may be carried out with respect to the wiring structure 6 again as shown in FIG. 1H. In this case, the flash tube heating process is not applied before forming the additional layer 8, but the flash tube heating process is carried out with respect to the copper wiring layer 4 only after forming the additional layer 8, whereby the wiring structure 6 may be formed. On the other hand, there is a problem that, if infrared-ray lamp annealing or furnace annealing is carried out after a silicon nitride layer has been formed on the copper wiring layer 4, voids are likely to occur during crystalline growth. In contrast, in the flash tube heating process, as described above, an annealing time or period is short. For this reason, there is an advantage that, even if flash tube annealing is carried out after a silicon nitride layer has been formed on the copper wiring layer 4, voids are unlikely to occur.

Figure 5C:
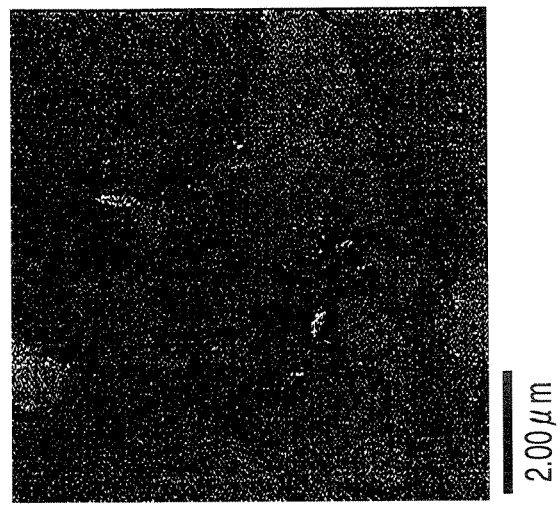
FIG. 5C is a crystalline orientation lamp of a wiring structure formed by carrying out heat treatment using a flash tube.
Figure 5B:
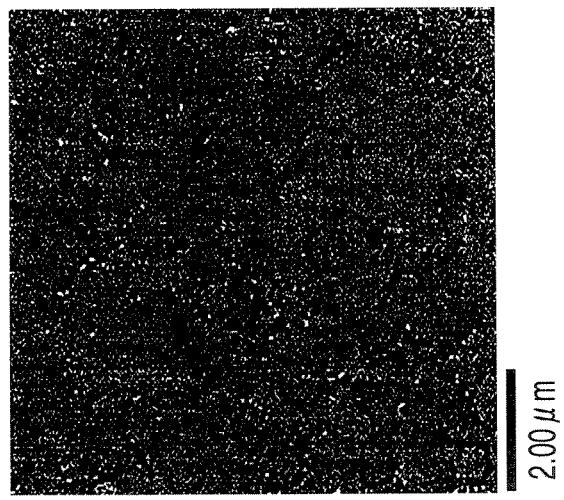
FIG. 5B is a crystalline orientation map analyzed in accordance with a backward electron beam scattering method, of a wiring structure formed by heating a metal layer by using an infrared-ray lamp.
Figure 5A:
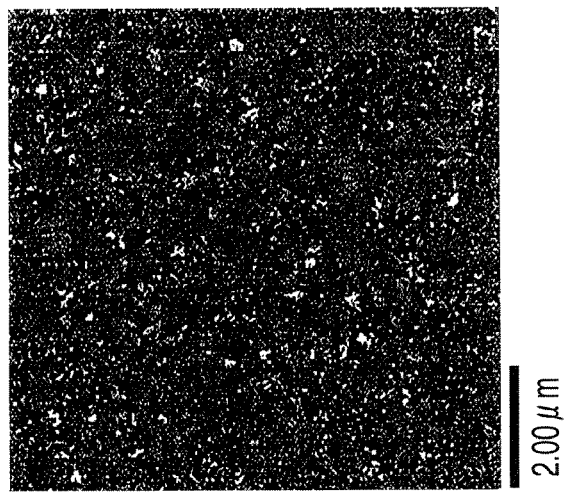
FIG. 5A is a crystalline orientation map analyzed in accordance with a backward electron beam scattering method, of a metal layer in which no annealing processing is carried out.

FIG. 5A shows a crystalline orientation map analyzed by a backward electron beam scattering method, of a metal layer in which any annealing process is not carried out. FIG. 5B shows a crystalline orientation map of a wiring structure formed by heating a metal layer using an infrared-ray lamp (450° C., 10 minutes), and FIG. 5C shows a crystalline orientation map of a wiring structure formed by carrying out heat treatment using a flash tube according to the present invention. From the FIGS. 5B and 5C, as is evident from one skilled in the art, any main crystalline orientation has been a (111) face. FIGS. 6A to 6C respectively show crystalline grain size maps including twin crystals shown in FIGS. 5A to 5C. As is evident from FIGS. 6A to 6C, the average crystalline grain size before heated has been in order of 0.2 µm, the crystalline grain size after heated increases. If the crystalline grain size increases, scattering in the electron crystalline grain size is lowered. Thus, although a specific resistance before heated has been in order of 2 to 2.4 µΩcm, the resistance after flash tube annealed is lowered to 1.7 to 1.8 µΩcm, and is substantially close to a specific resistance value (1.67 µΩm) of a bulk. In addition, such an increase of crystalline grain size is effective to improve an electron migration resistance and to reduce an occurrence of voids.

Figure 7:
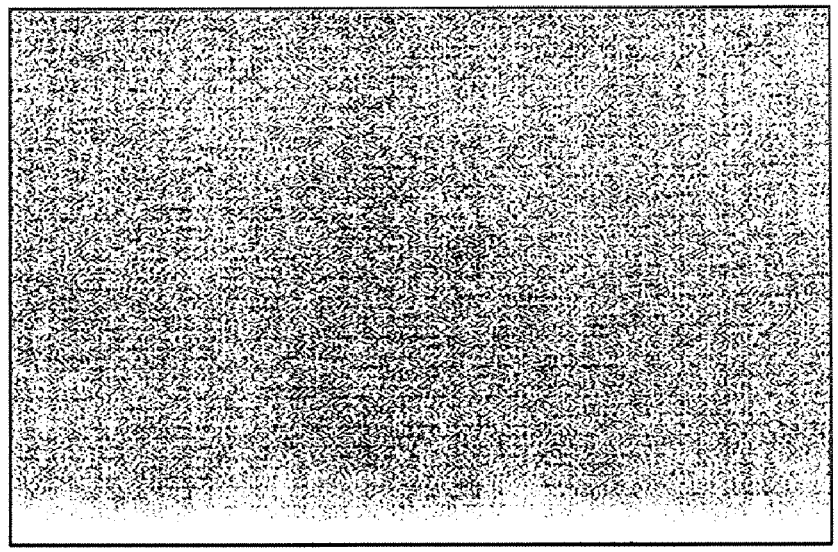
FIG. 7 shows a secondary electron microgram (SEM) obtained when observing irregularities of a copper wiring structure surface heated by a flash tube.
Figure 8:
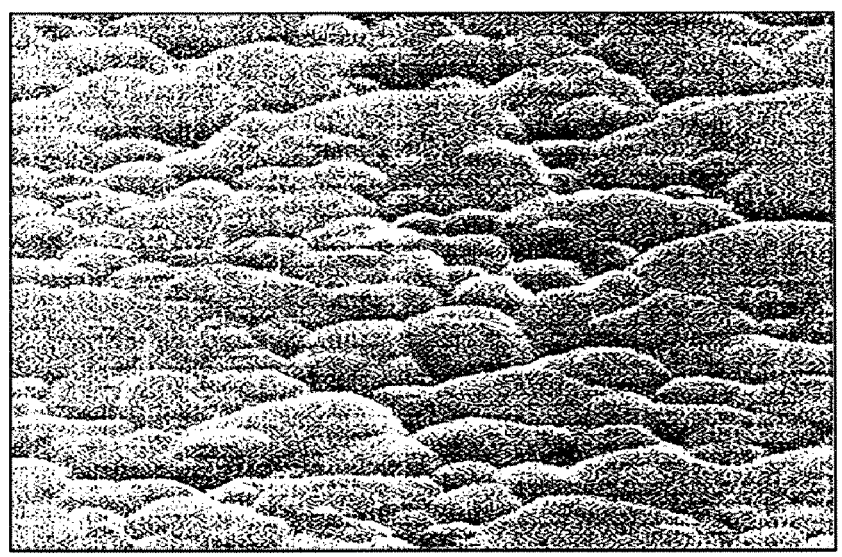
FIG. 8 shows a secondary electron microgram (SEM) obtained when observing surface irregularities of a copper wiring layer heated by an infrared lamp.

FIG. 7 shows a secondary electron microgram (SEM) obtained for observing irregularities of a wiring structure surface of copper heated by a flash tube. FIG. 8 shows an SEM obtained for observing surface irregularities of a copper wiring layer heated by an infrared-ray lamp (400° C., 10 minutes). As shown in FIGS. 7 and 8, the wiring structure heated by the infrared-ray lamp is increased in surface irregularities, but the copper wiring layer heated by the flash tube is almost identical in size before heated.

As described above, according to the wiring structure forming method of the embodiment, annealing for a short time is carried out, so that crystalline grain size can be increased while an increase of surface irregularities is restricted. Therefore, a wiring structure 6 having small surface irregularities and low electric resistance can be obtained.

While the wiring structure forming method according to the embodiment has described a case in which a metal layer (copper wiring layer) 4 made of copper or consisting essentially of copper has been formed in accordance with a sputtering method, the method for forming the metal layer (copper wiring layer) 4 is not limited to the copper wiring layer. The metal layer 4 may be applied to a process for manufacturing another metal layer such as, for example, molybdenum, tantalum, titanium, tungsten, aluminum layer, nickel, or a cobalt layer.

Hereinafter, a second embodiment of the present invention will be described with reference to FIGS. 9A to 9G. The present embodiment describes another aspect of the wiring structure according to the present invention.

Figure 9A:
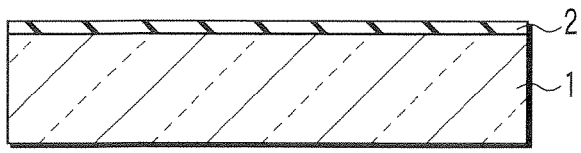
FIGS. 9A to 9G are process charts for explaining a first half portion of a wiring structure forming method according to a second embodiment of the present invention.
Figure 9B:
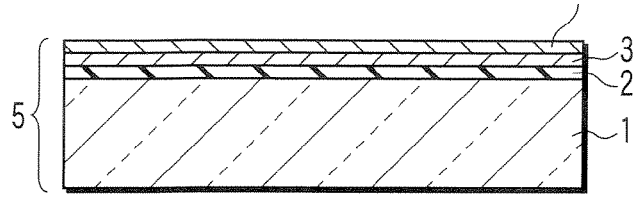

The process shown in FIG. 9A is identical to that shown in FIG. 1A according to the first embodiment described above. Next, as shown in FIG. 9B, a barrier metal layer 3 and a seed layer 9 (for example, a copper seed layer made of copper or consisting essentially of copper) are sequentially continuously formed on an undercoat insulating layer 2. In this case, the undercoat insulating layer 2, the barrier metal layer 3, and the seed layer 9 formed on the substrate 1 serve as a base substance 5. The seed layer 9 forms a wiring structure 6 later together with the metal layer 4.

Figure 9C:
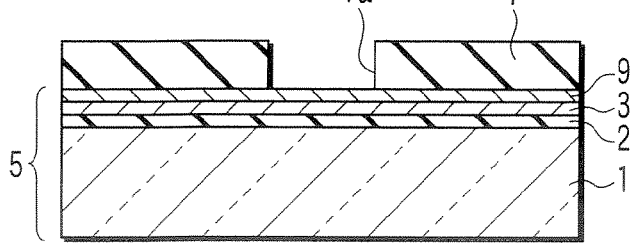
Figure 9D:
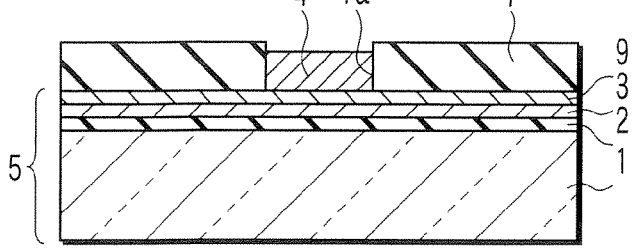
Figure 9E:
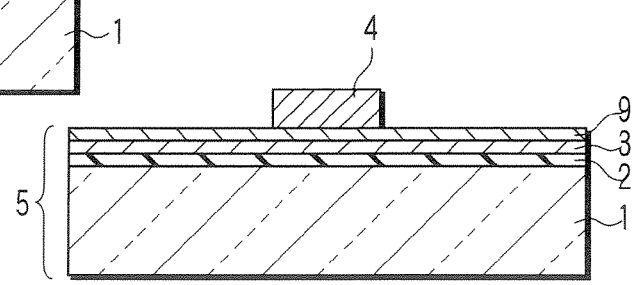
Figure 9F:
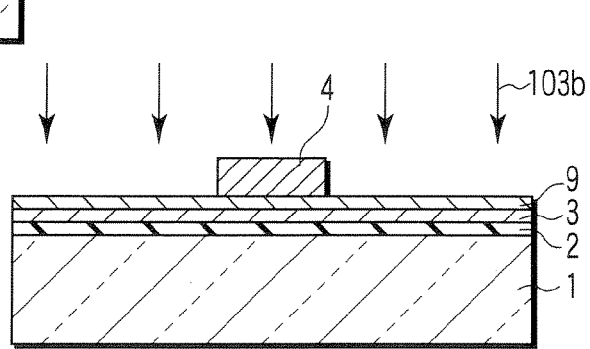

Next, a photoresist film 7 is formed on the seed layer 9, and, as shown in FIG. 9C, a resist groove 7a is formed on the photoresist film 7 such that the surface of the seed layer 9 is exposed on only a desired region. Next, as shown in FIG. 9D, a metal layer, for example, a metal layer 4 made of only copper or consisting essentially of copper (hereinafter, referred to as copper wiring layer) is formed in accordance with a non-electrolytic plating method, in a portion of the seed layer 9 exposed by the resist groove 7a. Then, as shown in FIG. 9E, the photoresist film 7 is released from the top of the seed layer 9 by using a release solution or the like.

Next, as shown in FIG. 9A, the copper wiring layer 4 is irradiated with flash tube light 103b as indicated by the arrow in the same manner as that shown in FIG. 1C of the first embodiment described above, so that a flash tube processing step is carried out. Then, with the copper wiring layer 4 being a mask, a portion other than a region forming the wiring structure 6 from among the seed layer 9 is removed by means of etching. As a result, the wiring structure 6 is formed while the seed layer 9 forms one of the constituent elements.

Figure 9G:
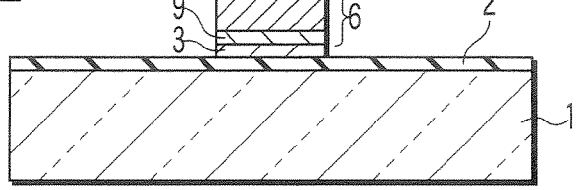

As shown in FIG. 9G, following etching of the above seed layer 9, a portion other than a region forming the wiring structure 6 from among the barrier metal layer 3 may be removed by means of etching. In addition, instead of the above process shown in FIG. 9F or in addition to this process, the flash tube heating process is applied to the seed layer 9 before the process shown in FIG. 9C (before forming the resist groove 7a), so that crystalline grain size of the seed layer 9 forming part of the wiring structure may be increased. In the case where the flash tube heating process is applied to the seed layer 9, there is an advantage that the crystalline grain size immediately after filmed for non-electrolytic plating can be increased. That is, if an increase of crystalline grain size is thus carried out, the crystalline grain size of the copper wiring layer 4 formed later can be further increased. In addition, following the etching process of forming the copper wiring layer 4 shown in FIG. 9G, the flash tube heating process may be carried out with respect to the wiring structure or this heating process may be added.

If a thin film such as the seed layer 9 is processed to be heated by infrared lamp annealing or furnace annealing, coagulation of atoms (molecules) is likely to occur. However, there is an advantage that aggregation of atoms is likely to occur because annealing time is short in the flash tube heating process.

The flash tube heating process according to the present invention is effective for a metal layer such as a copper wiring layer consisting essentially of copper formed in accordance with a damascene process and an electrolytic plating process as shown in FIGS. 10A to 10D. That is, in this case as well, the copper wiring layer is annealed in accordance with a direct flash run heating process, thereby making it possible to reduce voids.

This method will be described below in brief.

First, as shown in FIG. 10A, an insulating film 72 made of a silicon oxide film having film thickness of 1,000 nm is deposited on a substrate 71 such as a semiconductor substrate or an insulating substrate in accordance with, for example, a CVD method. Then, a resist pattern (not shown) is formed on the insulating film 72, dry etching is applied to the insulating film 72 with the resist pattern being a mask, and a hole 73 of, for example, 200 nm in diameter, and a wiring groove 74 of, for example, 240 nm in width are formed in the insulating film 72. The hole 73 is formed so as to reach the substrate 71 or lower layer wiring (not shown) formed on the substrate 71.

Next, as shown in FIG. 10B, a laminate barrier metal layer 75 composed of a tantalum nitride film and a tantalum film each having film thickness of 35 nm is deposited fully on the insulating film 72 including the hole 73 and an interior face of the wiring groove 74 in accordance with a sputtering method such that a space portion remains in each of the hole 73 and the wiring groove 74. Subsequently, in accordance with the sputtering method, a seed layer 76 made of a copper film having film thickness of 150 nm is deposited fully on the barrier metal layer 75 such that a space portion remains in each of the hole 73 and the wiring groove 74. The barrier metal layer 75 functions as a barrier layer or a coherent layer.

As shown in FIG. 10C, with the seed layer 76 being a seed layer, a plating layer 77 made of a copper film is caused to grow fully on the seed layer in accordance with an electrolytic plating method such that the hole 73 and the wiring groove 74 are completely embedded.

Next, as shown in FIG. 10D, the plating layer 77 is irradiated with flash tube light 103b as indicated by the arrow, and a flash tube heating process is carried out. Then, as shown in FIG. 10E, portions of the barrier metal layer 75, the seed layer 76, and the plating layer 77 on the substrate 71 excluding a recess are removed by the CMP, and the top face is smoothened to form a wiring structure.

The flash tube heating process shown in FIG. 10D may be carried out only after the CMP or before and after the CMP.

As described above, according to the wiring structure forming method of the embodiment, crystalline grain size can be increased while an increase of surface irregularities is restricted by carrying out annealing for a short time. Consequently, a wiring structure having small surface irregularities and low specific resistance can be obtained.

Now, with reference to FIGS. 11 to 13, a description will be given with respect to a method for forming a wiring structure and a semiconductor according to a third embodiment of the present invention. While the present embodiment describes a method for manufacturing a bottom gate type amorphous silicon TFT as a method for manufacturing a semiconductor device, the semiconductor device is not limited thereto.

Figure 11:
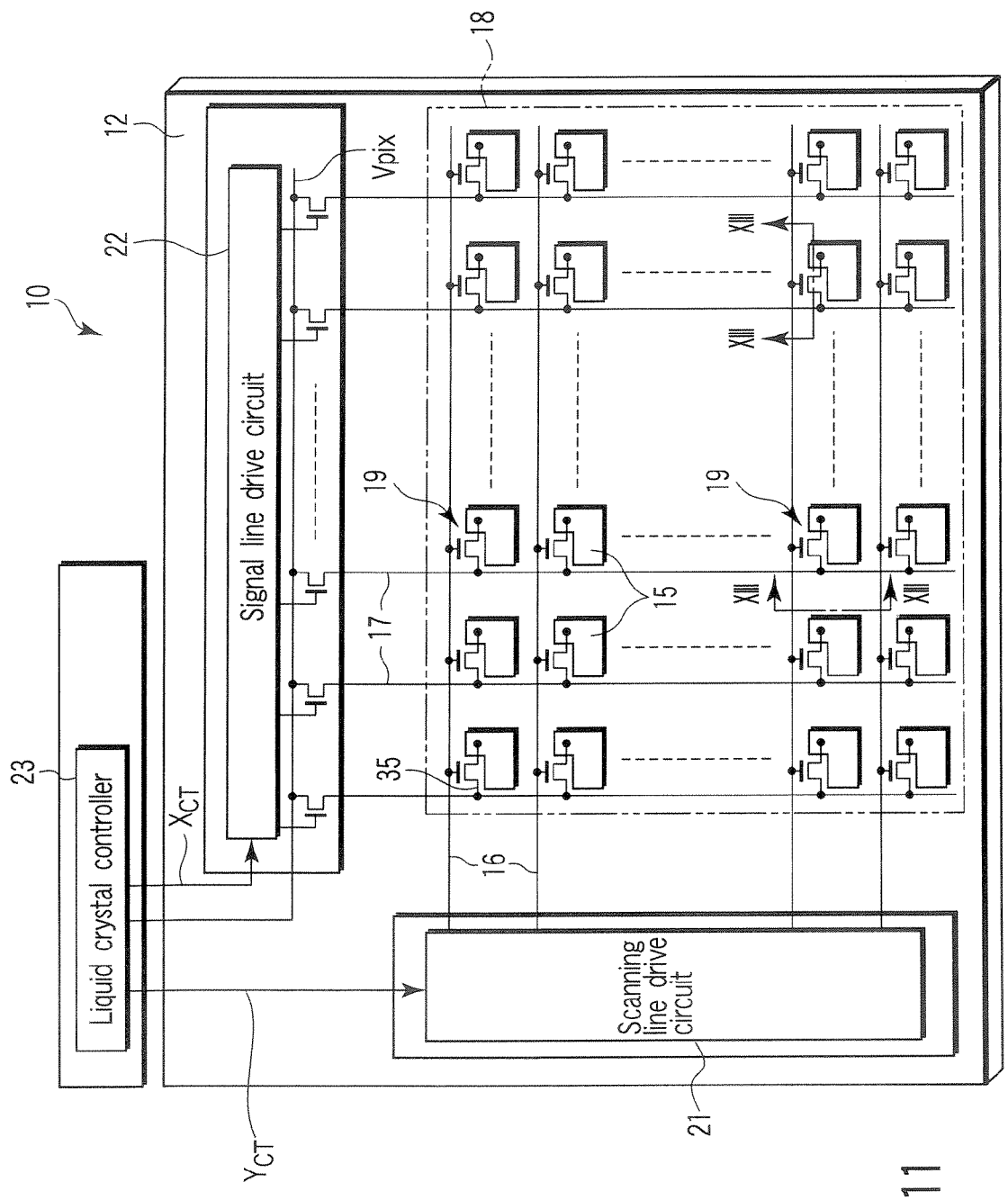
FIG. 11 is a plan view showing a display device comprising a thin-film transistor as a semiconductor device formed in accordance with a semiconductor device forming method according to a third embodiment of the present invention.

FIG. 11 schematically depicts an example of an equivalent circuit of an active matrix type liquid crystal display device 10 that serves as a display device. The liquid crystal display device 10 comprises: a pair of transparent substrates 11 and 12; a liquid crystal layer 13; an undercoat insulating layer 14; a pixel electrode 15; a scanning line 16 formed of a wiring structure 6; a signal line 17; an opposite electrode 18; a thin-film transistor 19 (hereinafter, referred to as a TFT) serving as a semiconductor device or a driving element; a scanning line drive circuit 21; a signal line drive circuit 22; and a liquid crystal controller 23.

For example, a pair of glass plates can be used as the transparent substrates 11 and 12. These transparent substrates 11 and 12 are bonded at the periphery so as to be opposed to have a predetermined gap each other via a frame shaped sealing material (not shown). Then, the liquid crystal layer 13 is provided in a region surrounded by the sealing material between the pair of transparent substrates 11 and 12.

The undercoat insulating layer 14, the plurality of element electrodes 15, the plurality of scanning lines 16, the plurality of signal lines 17, and the plurality of TFTs 19, etc., are provided on an interior face of the transparent substrate 12 at the rear side (at the lower side in FIGS. 12 and 13), for example, of one of the pair of transparent substrates 11 and 12. (In these figures, a plurality of storage capacitors formed of a material identical to that of an ordinary scanning line are not shown).

The undercoat insulating layer 14 can be formed of silicon oxide or silicon nitride. The plurality of pixel electrodes 15 are arranged in a matrix shape in a row direction and a column direction, each of which is formed of a transparent electrode formed of, for example, ITO. As shown in FIG. 12, the TFTs 19 are provided on the undercoat insulating layer 14, each of which comprises a gate electrode 31 (that also serves as the wiring structure 6 in the embodiment); a gate insulating film 32; a semiconductor layer 33; a source electrode 34; and a drain electrode 35. In addition, these TFTs 19 each are provided so as to be associated with each other on 1 to 1 basis with respect to the pixel electrodes 15 such that the source electrode 34 is electrically connected to the plurality of pixel electrodes 15 arranged on a matrix.

Figure 13:
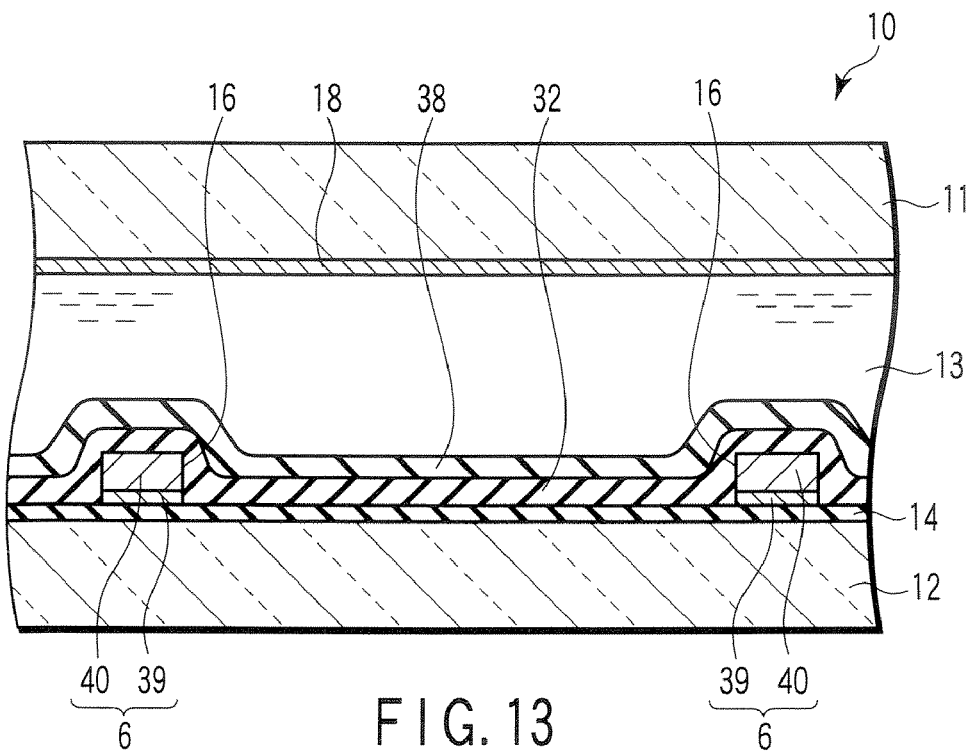
FIG. 13 is a sectional view taken along the line XIII-XIII shown in FIG. 11.

The scanning lines 16 are provided on the undercoat insulating layer 14 so as to extend in parallel to each other in a row direction of the pixel electrodes 15 provided in a matrix shape (in a transverse direction in FIG. 11 and in a direction orthogonal to paper face in FIG. 13). These scanning lines 16 are electrically connected to the gate electrode 31 of the TFT 19. In addition, one end of each of the scanning lines 16 is electrically connected to the scanning line drive circuit 21.

The signal lines 17 are provided on the gate insulating film 32 so as to extend in parallel to each other along a column direction (in a vertical direction in FIG. 11) of the pixel electrodes 15 provided in a matrix. These scanning lines 17 each are electrically connected to the drain electrode 35 of the corresponding TFT 19. Further, one end of each of the signal lines 17 is electrically connected to the signal line drive circuit 22.

Figure 12:
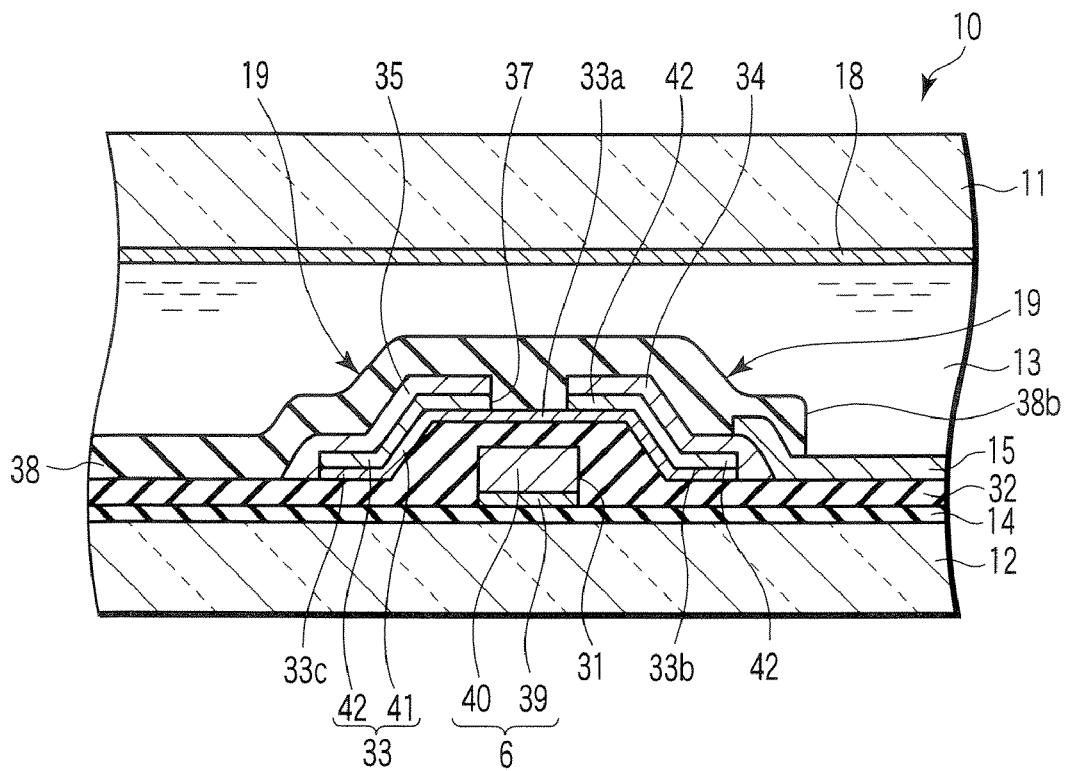
FIG. 12 is a sectional view taken along the line XII-XII shown in FIG. 11.

The TFT 19 is provided as a bottom gate type amorphous silicon TFT as shown in FIG. 12. In such a TFT, as described above, the gate electrode 31 is provided on the undercoat insulating layer 14, and the gate insulating film 32 is provided so as to cover the gate electrode 31, scanning lines 16, and undercoat insulating layer 14. Examples of the gate insulating layer 32 include a silicon oxide film, a silicon nitride film, or a laminate film formed of the silicon oxide film and the silicon nitride film. The semiconductor layer 33 has a non-doped amorphous silicon layer (non-doped a-Si layer) 41, and an $n^+$ type amorphous silicon layer ($n^+$ type a-Si layer) 42 serving as a pair of contact layers. The non-doped a-Si layer 41 has: a source region 33b and a drain region 33c which are provided on the gate insulting film 32, each of which is positioned under the pair of $n^+$ type amorphous silicon layers ($n^+$ type a-Si layers) 42; and a channel region 33a positioned between the regions 33b and 33c. In addition, this channel region 33a is positioned above the gate electrode 31.

The source electrode 34 and drain electrode 35 each are provided on the contact layer ($n^+$ type a-Si layer 42) on the regions 33b and 33c so as to be electrically connected to the source region 33b and the drain region 33c. One of the source electrode 34 and the drain electrode 35, for example, the drain electrode 35 is electrically connected to the corresponding signal line 17.

A passivation layer 38 having an opening 38b for exposing the pixel electrode 15 is provided so as to cover the source electrode 34, drain electrode 35, signal lines 17, and gate insulating film 32.

As shown in FIG. 11, the scanning line drive circuit 21 and signal line drive circuit 22 each are connected to the liquid crystal controller 23. The liquid crystal controller 23 receives, for example, an image signal and a sync signal supplied from the outside, and supplies a pixel video signal $V_{pix}$, a vertical scanning control signal $Y_{CT}$, and a horizontal scanning control signal $X_{CT}$ to the signal line 17, the scanning line drive circuit 21, and the signal line drive signal 22, respectively.

On the interior face of the transparent substrate 11 at the front side (upper side in FIGS. 12 and 13), one film shaped transparent opposite electrode (common electrode) 18 is provided so as to be opposed to the plurality of pixel electrodes 15. Pixel regions allocated in a matrix shape are configured together with the pixel electrodes 15. The opposite electrode 18 is formed of, for example, ITO. On the interior face of the transparent substrate 11, color filters may be provided to be associated with the plurality of pixel regions, and light shield films may be provided to be associated with regions between the pixel regions.

Polarizing plates (not shown) are provided on the exterior face of each of the pair of transparent substrates 11 and 12. In the case where the liquid crystal display device 10 is of transparent type, a planar light source (not shown) is provided backward of the backward transparent substrate 12. The liquid crystal display device 10 may be of reflection type or of semitransparent reflection type.

The scanning line 16 is formed of a wiring structure 6 consisting essentially of copper. A barrier metal layer 39 is provided to improve coherency with the scanning line 16 and undercoat insulating layer 14 and to restrict copper diffusion from the scanning line 16 to the undercoat insulating layer 14. A capping metal layer, an insulating layer or the like for restraining copper diffusion may be provided on the scanning line 16. The scanning line 16 can be formed in the same manner as that of the wiring structure 6 according to the first embodiment. Further, the gate electrode 31 can be formed simultaneously with the scanning line 16.

Now, a description will be given here with respect to a process for forming a film on an interior face of the backward transparent substrate 12 and a method for forming the TFT 19.

First, a glass plate having thickness of 0.7 mm is prepared as the backward transparent substrate 12. On the transparent substrate 12 (corresponding to the substrate 1 in the method for forming the wiring structure according to the first embodiment), a laminate film is formed, the laminate film being formed of silicon nitride and silicon oxide layers, which serves as an undercoat insulating layer 14 (corresponding to the undercoat insulating layer 2 in the wiring structure forming method according to the first embodiment). In the present embodiment, the film thickness of the undercoat insulating layer 14 is defined as 400 nm. The undercoat insulating layers 14 are continuously deposited and formed on the transparent substrate 12 such that the thickness of the silicon nitride layer is 200 nm and the thickness of the silicon oxide layer is 200 nm, by using a CVD method (for example, the plasma enhanced chemical vapor deposition [PE-CVD] method).

Next, a barrier metal layer 39 (corresponding to the barrier metal layer 3 in the wiring structure forming method according to the first embodiment) is formed on the undercoat insulating layer 14. The barrier metal 39 can be formed as a film in accordance with a sputtering method. As a material for the barrier metal layer 39, Ta, TaN, TiN, Me, MoW or the like is used solely or in combination. The undercoat insulating layer 14 and the barrier metal layer 39 are formed on the transparent substrate 12 so as to be a base substance (which is not shown and corresponds to the base substance 5 in the wiring structure forming method according to the first embodiment) for forming a scanning line 16 (wiring structure 6), a gate electrode 31 (wiring structure 6) and a bottom gate type TFT 19.

Next, the scanning line 16 and the gate electrode 31 are formed on the base substance, that is, on the barrier metal layer 39. This can be carried out in the same manner as that in the wiring structure forming method according to the first embodiment. That is, on the base substance (on the barrier metal layer 39), for example, a copper wiring layer consisting essentially of copper (which is not shown and corresponds to the copper wiring layer 4 in the wiring structure forming method according to the first embodiment) is formed as a metal layer. Hereinafter, a metal layer is referred to as a copper wiring layer.

This copper wiring layer can be continuously formed as a film after the barrier metal layer 39 has been formed as a film in accordance with a sputtering method. In this embodiment, the thickness of the copper wiring layer is 500 nm. Then, the copper wiring layer is irradiated with flash tube light. In this manner, the copper wiring layer made of copper simplex or consisting essentially of copper is heated to enter a melted, semi-melted, or non-melted state. This is identical to the flash tube heating process according to the first embodiment. In this manner, a wiring structure 40 is formed.

After the wiring structure 40 described above has been formed, the wiring structure 40 and the barrier metal layer 39 are processed to be etched in a desired wiring pattern to form the gate electrode 31 and the scanning line 16 serving as the wiring structure 6 having the wiring structure 40 and the barrier metal layer 39.

Subsequently, a gate insulating film 32 is formed so as to cover the gate electrode 31 and the scanning line 16. The copper wiring layer and the barrier metal layer 39 are processed to be etched in a desired wiring pattern. In addition, after the gate insulating layer 32 has been formed on these layers, annealing process is carried out using the flash tube 103 (FIG. 2), whereby the gate electrode 32 and the scanning line 16 serving as the wiring structure 6 may be formed. At that time, it is desirable to use at least part of the gate insulating film 32 having capability of preventing diffusion of copper such as silicon nitride.

Next, a semiconductor layer 33 is formed on the gate insulating film 32. In detail, a non-doped a-Si layer and $n^+$ a-Si layer are sequentially formed on the gate insulating film 32 and on the non-doped a-Si layer 41. With these films being patterned, the non-doped a-Si layer 41 and $n^+$ type a-Si layer 42 are formed in the same external shape, and then, the source electrode 34 and the drain electrode 35 are formed on the $n^+$ type a-Si layer 42, respectively. These electrodes can be formed by forming as the $n^+$ type a-Si layer 42 an aluminum layer serving as the source electrode 34 and the drain electrode 35, and then, etching the aluminum layer in a predetermined pattern. Thereafter, with the source electrode 34 and the drain electrode 35 being masks, a portion of the $n^+$ type a-Si layer positioned between the electrodes is removed by means of etching, and a channel region 33a is exposed to form a TFT 19.

Next, a signal line 17 is formed on the gate insulating film 32 so as to be electrically connected to the drain electrode 35, and a pixel electrode 15 is formed so as to be electrically connected to the source electrode 34. In addition, a passivation layer 38 is formed as a film so as to cover the TFT 19, gate insulating film 32, and pixel electrode 15, thereby forming an opening 38b for exposing the pixel electrode 15 to the passivation layer 38. With the above procedures, a process for forming a film on the backward transparent substrate 12 is completed.

According to the wiring structure forming method and semiconductor forming method of the present embodiment, crystalline grain size can be increased while an increase of surface irregularities is restricted by carrying out annealing for a short time. Therefore, a wiring structure 6 (scanning line 16 and gate electrode 31) and a semiconductor device (TFT) 19 having small surface irregularities and low electrical resistance can be obtained.

In the wiring structure forming method and semiconductor forming method of the present embodiment, as in the wiring structure forming method according to the first embodiment, copper wiring layers are continuously formed as films on a barrier metal layer in accordance with the sputtering method. However, the wiring structure forming method according to the second embodiment may be provided. That is, a seed layer is formed on a barrier metal layer on which a photoresist film is formed, and the resulting film is processed to be exposed/developed in a predetermined pattern. A copper wiring layer is formed in a resist groove of the formed photoresist film in accordance with a non-electrolytic plating method, and a photoresist film is released. Then, annealing process using a flash tube is carried out to etch the seed layer. With a copper wiring layer being a mask, a barrier metal layer is etched. In this case, annealing process using a flash tube may be carried after etching the barrier metal layer. Further, after etching the barrier metal layer, a capping metal layer such as CoB or CoWB is formed in accordance with the electroless plating method so as to cover at least a surface of a copper wiring layer so as to carry out annealing processing using the flash tube, in order to prevent copper diffusion.

Figure 14:
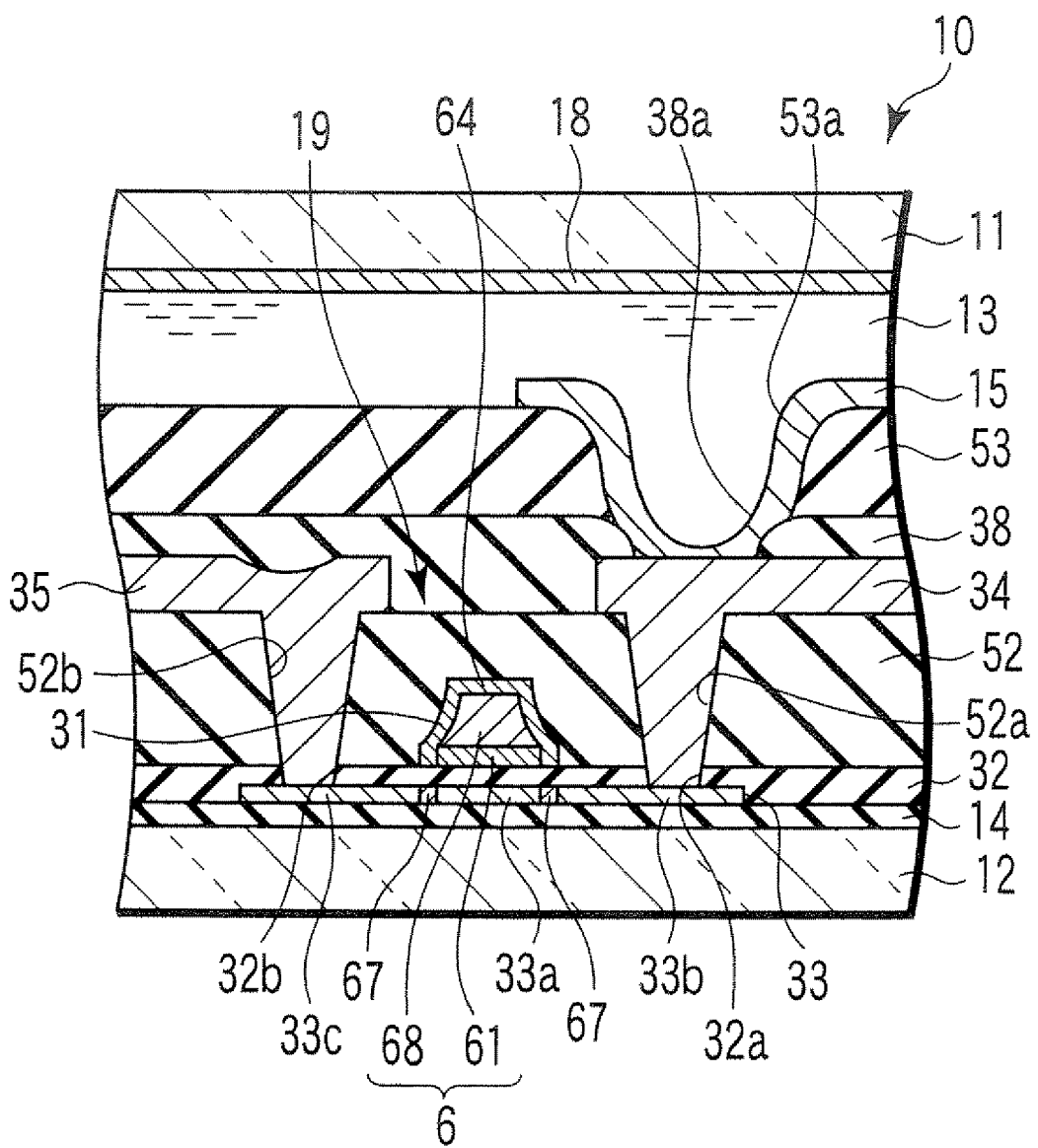
FIG. 14 is a sectional view of a display device comprising another example of a thin-film transistor as a semiconductor device.

Hereinafter, with reference to FIG. 14, a fourth embodiment of the present invention will be described with respect to another embodiment of a method for forming a semiconductor. The present embodiment describes a method for manufacturing a top gate type poly-silicon TFT (n-type TFT having LDD structure) as a method for manufacturing a semiconductor device 19.

In the present embodiment, a TFT serving as the semiconductor device 19 has a source electrode 34 and a drain electrode 35 serving as a wiring structure 6. The source electrode 34 and drain electrode 35 can be formed in a method similar to the method for forming the wiring structure 6 in the first and second embodiments. In the fourth embodiment, a base substance is obtained in a state in which a gate insulating film 32 and an inter-layered insulating layer 52 are selectively etched to form contact holes 32a, 52a, 32b, and 52b opening up to a surface of a source region 33b and a drain region 33c. Another configuration is identical to that of the third embodiment described above, including a configuration which is not shown. Thus, like constituent elements are designated by like reference numerals, and a duplicate description is omitted here.

A flash tube heating process is applied to the copper wiring layer 62. The flash tube heating process has an advantage that copper diffusion at the time of annealing of the copper wiring layer 62 can be restricted because a heating time is short.

In accordance with the procedures as described above, a semiconductor device 19 (TFT 20b) having small surface irregularities and low specific resistance can be obtained.

In the above-described embodiment, a barrier metal layer is provided between an undercoat insulating layer and a copper layer in order to improve adhesion and to prevent diffusion. However, a copper layer including magnesium (Mg), titanium (Ti), molybdenum (Mo), tantalum (Ta), chromium (Cr) or the like is used, whereby improvement of adhesion with the undercoat insulating layer and the prevention of diffusion using a barrier oxide layer such as MgO, $Ta_2O_5$ formed between the undercoat layer and copper layer after heat treatment may be carried out without providing the barrier metal layer.

The wiring structure forming method and semiconductor device forming method according to the present invention are not limited to a wiring structure forming method and a semiconductor device forming method in the course of manufacture of a liquid crystal display device. The present invention can be applied as a wiring structure forming and a semiconductor device forming method in the course of manufacture of a display device such as, for example, an inorganic ELD device or an organic ELD device.

In the above-described embodiment, a description has been given by way of example of the scanning line 16, the gate electrode 31, the source electrode 34, and the drain electrode 35 serving as the wiring structure 6, but the wiring structure forming method according to the invention is not limited to these forming methods. The wiring structure forming method according to the invention can be widely applied to a method for forming the signal line 17 or other various wires, electrodes, terminals and the like.

In addition, while a description has been given by way of example of the TFT 20a and TFT 20b as the semiconductor device 19 in the above-described embodiments, the method for forming the semiconductor device according to the invention can be widely applied as a variety of semiconductor device manufacturing methods.

Further, while, in the above-described embodiment, a description has been given by way of example of a copper wiring layer consisting essentially of copper as a metal layer, the metal layer is not limited to a copper wiring layer consisting essentially of copper.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a wiring structure, the method comprising:
    forming an undercoat insulating layer that includes a flat upper surface on a substrate;
    forming a seed layer made of copper on the flat upper surface of the undercoat insulating layer;
    heating the seed layer by irradiating the seed layer with light emitted from at least one flash tube to increase a crystal grain size of the seed layer;
    partially covering the flat upper surface of the seed layer with a covering layer to expose at least one region of an upper surface of the seed layer;
    forming a metal layer made of copper on the exposed region of the flat upper surface of the seed layer of which crystal grain size has been increased, by a non-electrolytic plating method; and
    decreasing the resistivity of the metal layer to 1.7 to 1.8 $\mu\Omega$cm by annealing the metal layer on the substrate contained in a container in which an inert gas is introduced, by irradiating the metal layer with light emitted from at least one flash tube.

2. A method for forming a wiring structure, the method comprising:
    forming an undercoat insulating layer on a substrate;
    forming a seed layer made of copper on the undercoat insulating layer;
    heating the seed layer by irradiating the seed layer with light emitted from at least one flash tube to increase a crystal grain size of the seed layer;
    partially covering a flat upper surface portion of the seed layer with a covering layer to expose at least one region of an upper surface of the seed layer;
    forming a metal layer made of copper on the exposed region of the flat upper surface of the seed layer of which crystal grain size has been increased, by a non-electrolytic plating method; and
    decreasing the resistivity of the metal layer to 1.7 to 1.8 $\mu\Omega$cm by annealing the metal layer on the substrate contained in a container in which an inert gas is introduced, by irradiating the metal layer with light emitted from at least one flash tube having maximum intensity in a wavelength range of 300 to 600 nm.

3. A method for forming a wiring structure, the method comprising:
    forming an undercoat insulating layer on a substrate;
    forming a seed layer made of copper on the undercoat insulating layer;
    heating the seed layer by irradiating the seed layer with light emitted from at least one flash tube to increase a crystal grain size of the seed layer;
    partially covering a flat upper surface portion of the seed layer with a covering layer to expose at least one region of an upper surface of the seed layer;
    forming a metal layer made of copper on the exposed region of the flat upper surface of the seed layer of which crystal grain size has been increased, by a non-electrolytic plating method; and
    etching the seed layer in a wiring pattern shape, and forming a wiring structure pattern out of the metal and seed layers; and
    decreasing the resistivity of the metal layer to 1.7 to 1.8 $\mu\Omega$cm by annealing the metal layer on the substrate contained in a container in which an inert gas is introduced, by irradiating the wiring structure pattern with light emitted from at least one flash tube.

4. The method for forming a wiring structure, according to any one of claims 1 to 3, wherein the light is pulse light whose pulse width is set in the range of 0.1 to 10 ms.

5. The method for forming a wiring structure, according to any one of claims 1 to 3, wherein the metal layer consists essentially of copper.

6. The method for forming a wiring structure, according to any one of claims 1 to 3, wherein the annealing is carried out by emitting light while stepwise feeding and/or repetition feeding is carried out to change a relative position relationship between the substrate and the flash tube.

7. The method for forming a wiring structure, according to any one of claims 1 to 3, wherein the annealing includes:
    forming a protective insulating film on the metal layer; and
    emitting light from above the protective insulating film in an atmosphere of the inert gas.

8. The method according to any one of claims 1 to 3, wherein a main crystalline orientation of the wiring structure is a (111) face.

* * * * *